United States Patent
Zhang et al.

(10) Patent No.: US 11,495,649 B2
(45) Date of Patent: Nov. 8, 2022

(54) DISPLAY SUBSTRATE, METHOD FOR PREPARING THE SAME, AND DISPLAY PANEL

(71) Applicants: Ordos Yuansheng Optoelectronics Co., Ltd., Ordos (CN); BOE Technology Group Co., Ltd., Beijing (CN)

(72) Inventors: Guoping Zhang, Beijing (CN); Liman Peng, Beijing (CN); Qianqian Zhang, Beijing (CN); Qi Liu, Beijing (CN)

(73) Assignees: Ordos Yuansheng Optoelectronics Co., Ltd., Inner Mongolia (CN); BEIJING BOE TECHNOLOGY DEVELOPMENT CO., LTD., Bering (CN)

( * ) Notice: Subject to any disclaimer, the term of this patent is extended or adjusted under 35 U.S.C. 154(b) by 59 days.

(21) Appl. No.: 17/043,187

(22) PCT Filed: Mar. 30, 2020

(86) PCT No.: PCT/CN2020/082191
§ 371 (c)(1),
(2) Date: Sep. 29, 2020

(87) PCT Pub. No.: WO2020/216009
PCT Pub. Date: Oct. 29, 2020

(65) Prior Publication Data
US 2021/0376005 A1    Dec. 2, 2021

(30) Foreign Application Priority Data

Apr. 25, 2019 (CN) .......................... 201910337383.4

(51) Int. Cl.
*H01L 27/32* (2006.01)

(52) U.S. Cl.
CPC ........ *H01L 27/326* (2013.01); *H01L 27/3246* (2013.01); *H01L 2227/323* (2013.01)

(58) Field of Classification Search
CPC ............... H01L 27/326; H01L 27/3246; H01L 2227/323
(Continued)

(56) References Cited

U.S. PATENT DOCUMENTS

2016/0149155 A1*   5/2016   Kim .................... H01L 27/3258
                                                        438/23
2016/0233289 A1*   8/2016   Son ..................... H01L 27/3258
(Continued)

FOREIGN PATENT DOCUMENTS

CN          105097830 A      11/2015
CN          107464832 A      12/2017
(Continued)

OTHER PUBLICATIONS

English Machine Translation of CN 107464832 (Year: 2017).*
CN201910337383.4 OA1.

*Primary Examiner* — Dzung Tran
(74) *Attorney, Agent, or Firm* — IPro, PLLC

(57) ABSTRACT

The application relates to the technical field of display, and discloses a display substrate, a method for preparing the same, and a display panel. The display substrate includes a base substrate, a pixel circuit layer and a flat layer sequentially arranged on the base substrate, and anodes located on a side, away from the base substrate, of the flat layer and corresponding to pixel units one by one, wherein a plurality of grooves of which openings are away from the base substrate are formed in the flat layer, a boss is formed between each two adjacent grooves, and an orthographic projection of each pixel unit on the base substrate is overlapped with an orthographic projection of a corresponding groove on the base substrate; and in each pixel unit: the anode is formed on the boss, a hollow structure is arranged at a part, opposite to a corresponding groove of the flat layer, of the anode, and an orthographic projection of the anode on the base substrate is located within an orthographic projection of the boss on the base substrate. The flat layer is provided with openings and thus can accommodate anode deficiencies generated by the anodes; and the hollow structures of the anodes can avoid dark spots finally caused by (Continued)

anode deformation generated by high-pressure washing, and therefore, the yield is increased.

5 Claims, 8 Drawing Sheets

(58) Field of Classification Search
USPC .......................................................... 257/40
See application file for complete search history.

(56) References Cited

U.S. PATENT DOCUMENTS

| | | |
|---|---|---|
| 2017/0141341 A1 | 5/2017 | Liao et al. |
| 2017/0338444 A1* | 11/2017 | Teramoto ............ H01L 27/3211 |
| 2018/0006106 A1* | 1/2018 | Oh ...................... H01L 51/5228 |
| 2018/0061907 A1 | 3/2018 | Kim et al. |
| 2018/0350888 A1 | 12/2018 | Huo et al. |
| 2019/0019857 A1* | 1/2019 | Matsumoto ......... H01L 27/3246 |

FOREIGN PATENT DOCUMENTS

| | | | |
|---|---|---|---|
| CN | 107799555 | A | 3/2018 |
| CN | 108511492 | A | 9/2018 |
| CN | 110164924 | A | 8/2019 |
| EP | 3367457 | A1 | 8/2018 |

* cited by examiner

DISPLAY SUBSTRATE, METHOD FOR PREPARING THE SAME, AND DISPLAY PANEL

CROSS REFERENCE OF RELATED APPLICATIONS

The present application is a US National Stage of International Application No. PCT/CN2020/082191, filed on Mar. 30, 2020, which claims priority to Chinese Patent Application No. 201910337383.4, entitled ORGANIC ELECTROLUMINESCENT DEVICE AND METHOD FOR PREPARING THE SAME, filed on Apr. 25, 2019, the entire contents of which are incorporated in the present application by reference.

FIELD

The present application relates to the technical field of display, in particular to a display substrate, a method for preparing the same, and a display panel.

BACKGROUND

The light emitting principle of an active matrix organic light emitting diode (AMOLED) panel is extremely similar to that of a light emitting diode (LED), and movable electrons and holes are generated between two poles after voltage is applied to cathodes and anodes of a material. An AMOLED structure in the related art generally includes a base substrate, a pixel circuit layer, a flat layer, a pixel defining layer and anodes which are arranged in sequence. In a manufacturing process of the AMOLED, particles on a glass substrate need to be removed by using a high pressure micro jet (HPMJ) technology. Defective dark spots of the display panel are easily caused in such a cleaning process. A reject ratio possibly caused by the HPMJ technology reaches nearly 50%, so as to seriously influence the increase of yield, and slow down the progress of mass production.

SUMMARY

The present application provides a display substrate, a method for preparing the same, and a display panel, which are used for reducing the occurrence rate of dark spots, increasing yield and speeding up the progress of mass production.

The display substrate includes a base substrate, a pixel circuit layer and a flat layer which are arranged on the base substrate sequentially, and anodes located on a side, away from the base substrate, of the flat layer and corresponding to a plurality of pixel units one by one, wherein a plurality of grooves of which openings are away from the base substrate are formed in the flat layer, a boss is formed between each two adjacent grooves, and an orthographic projection of each pixel unit on the base substrate is overlapped with an orthographic projection of a corresponding groove on the base substrate; and in each pixel unit: an anode is formed on the boss; a hollow structure is formed at a part, opposite to a corresponding groove of the flat layer, of the anode; and an orthographic projection of the anode on the base substrate is located within an orthographic projection of the boss on the base substrate.

Optionally, the grooves are strip-shaped grooves extending in an arrangement direction of the pixel units, and orthographic projections of the grooves on the base substrate are overlapped with orthographic projections of the plurality of pixel units on the base substrate.

Optionally, the pixel units are distributed in an array mode and include a plurality of pixel unit columns and a plurality of pixel unit rows; the grooves formed in the flat layer correspond to the pixel unit columns one by one; and in each pair of a pixel unit column and a groove corresponding to the pixel unit column: the groove extends in a column direction of the pixel units, and an orthographic projection of each pixel unit in the pixel unit column on the base substrate is overlapped with an orthographic projection of the corresponding groove on the base substrate.

Optionally, the pixel units are distributed in an array mode and include a plurality of pixel unit columns and a plurality of pixel unit rows; the grooves formed in the flat layer correspond to the pixel unit rows one by one; and in each pair of a pixel unit row and a groove corresponding to the pixel unit row: the groove extends in a row direction of the pixel units, and an orthographic projection of each pixel unit in the pixel unit row on the base substrate is overlapped with an orthographic projection of the groove on the base substrate.

Optionally, the pixel units are distributed in an array mode, and the grooves formed in the flat layer correspond to the pixel units one by one; and in each pair of a pixel unit and a groove corresponding to the pixel unit: an orthographic projection of the groove on the base substrate is located within an orthographic projection of the pixel unit on the base substrate.

Optionally, the display substrate further includes a pixel defining layer; wherein pixel defining layer is located on a side, away from the base substrate, of the flat layer, and used for defining each pixel unit region; and an orthographic projection of the pixel defining layer on the base substrate is located within orthographic projections of the bosses on the base substrate.

Optionally, the display substrate further includes light emitting layers corresponding to the anodes one by one; and in each pair of an anode and a light emitting layer corresponding to the anode, the light emitting layer covers the anode and fills the corresponding groove of the flat layer and a hollow structure of the anode.

Optionally, cross sections of the grooves are rectangular.

A display panel includes any above-mentioned display substrate.

A method for preparing a display substrate, includes:

forming a pixel circuit layer, a flat layer and an anode layer on the base substrate sequentially, and forming a pattern of the flat layer and patterns of anodes through a patterning process, wherein in the pattern of the flat layer: a plurality of grooves of which openings are away from the base substrate are formed in the flat layer; a boss is formed between each two adjacent grooves, and an orthographic projection of each pixel unit on the base substrate is overlapped with an orthographic projection of the corresponding groove on the base substrate; and in a pattern of an anode in each pixel unit: the anode is formed on the boss; a hollow structure is formed at a part, opposite to a corresponding groove of the flat layer, of the anode; and an orthographic projection of the anode on the base substrate is located within an orthographic projection of the boss on the base substrate.

Optionally, the step of forming the pixel circuit layer, the flat layer and the anode layer on the base substrate sequentially, and forming the pattern of the flat layer and the patterns of the anodes through the patterning process, specifically includes:

forming the pixel circuit layer and the flat layer on the base substrate sequentially;

etching the flat layer, and forming the plurality of grooves on a side, away from the base substrate, of the flat layer;

depositing a pixel defining layer on the etched flat layer;

etching the pixel defining layer for etching away regions, opposite to the pixel units, of the pixel defining layer to expose the grooves;

depositing the anode layer; and etching the anode layer for etching away regions, opposite to the grooves, of the anode layer to form hollow structures.

Optionally, the step of forming the pixel circuit layer, the flat layer and the anode layer on the base substrate sequentially, and forming the pattern of the flat layer and the patterns of the anodes through the patterning technology, specifically includes:

forming the pixel circuit layer, the flat layer and the pixel defining layer on the base substrate sequentially;

coating the pixel defining layer with a layer of photoresist;

carrying out half tone exposure treatment on the photoresist; removing regions, opposite to groove regions to be formed in the flat layer, of the photoresist; reserving regions, opposite to a formed pattern of the pixel defining layer, of the photoresist, and removing other regions of the photoresist partially;

etching exposed regions of the pixel defining layer for the first time to form a plurality of grooves in the pixel defining layer;

carrying out ashing treatment on the photoresist, and removing parts except the regions, opposite to the formed pattern of the pixel defining layer, of the photoresist;

etching the pixel defining layer and the flat layer for etching away regions, opposite to pixel units, of the pixel defining layer, and for etching away regions, corresponding to the plurality of grooves of the pixel defining layer, of the flat layer, so as to form the plurality of grooves in the flat layer;

depositing the anode layer; and etching the anode layer for etching away regions, opposite to the grooves in the flat layer, of the anode layer to form hollow structures.

DETAILED DESCRIPTION OF THE EMBODIMENTS

The technical solutions in embodiments of the present application will be clearly and completely described in combination with accompanying drawings of the embodiments of the present application, and obviously, the described embodiments are only a part of, but not all embodiments of the present application. Based on the embodiments of the present application, all other embodiments obtained by those of ordinary skill in the art without any creative work fall within the scope of the present application.

In a manufacturing process of an active matrix organic light emitting diode (AMOLED) panel, particles on a glass substrate need to be removed by using a high pressure micro jet (HPMJ) technology. But a major disadvantage of the HPMJ technology is that defective dark spots of the display panel are easily caused in a cleaning process. Inventors find that due to too high pressure in the cleaning process of the HPMJ technology, an anode is easy to blow up until the anode is bent and deforms, severely, the anode may upwarp and break PDL in contact with the anode, and therefore the anode and a cathode are in short circuit, to form dark spots. A reject ratio possibly caused by the HPMJ technology reaches nearly 50%, so as to seriously influence the increase of yield, and slow down the progress of mass production.

Figure 1:
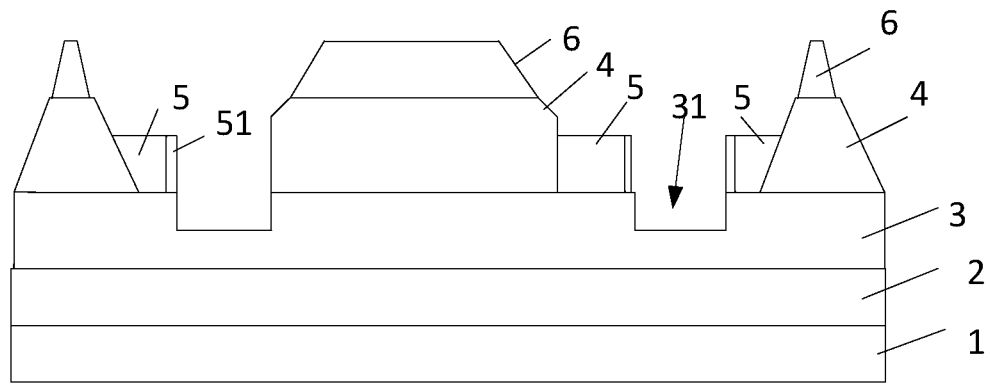
FIG. 1 is a structural schematic diagram of a cross section of a display substrate provided by an embodiment of the present application.

Accordingly, the present application provides a display substrate. Referring to FIG. 1 showing a structural schematic diagram of a display substrate, the display substrate includes a base substrate 1, a pixel circuit layer 2 and a flat layer 3 sequentially arranged on the base substrate, and anodes 5 formed on a side, away from the base substrate 1, of the flat layer 3 and corresponding to a plurality of pixel units one by one, wherein a plurality of grooves 31 of which openings are away from the base substrate 1 are formed in the flat layer 3, a boss is formed between each two adjacent grooves 31, and an orthographic projection of each pixel unit on the base substrate 1 is overlapped with an orthographic projection of a corresponding groove 31 on the base substrate 1; and in each pixel unit, an anode 5 in the pixel unit is formed on the boss; a hollow structure is arranged at a part, opposite to a corresponding groove 31 of the flat layer 3, of the anode 5; and an orthographic projection of the anode 5 on the base substrate 1 is located within an orthographic projection of the boss on the base substrate 1.

In the above-mentioned display substrate, the plurality of grooves 31 are formed in the flat layer 3 and the boss is formed between each two adjacent grooves 31; the anode 5 in each pixel unit is formed on the corresponding boss; the hollow structure is arranged at the part, opposite to the corresponding groove 31 of the flat layer 3, of the anode 5; and the orthographic projection of the anode 5 on the base substrate 1 is located within the orthographic projection of the boss on the base substrate 1. when the HPMJ technology is used for carrying out high pressure washing on the display substrate, the hollow structures of the anodes 5 can relieve stress, the anodes 5 are prevented from being bent and deforming, the grooves 31 of the flat layer 3 can accommodate anode deficiencies 51 caused by deformation or falling off of structures of the anodes 5, so that the occurrence of the dark spots of the display panel can be finally avoided, and the yield of the display panel can be increased.

Optionally, the formation of the hollow structures of the anode layer can be under two conditions as follows: under a first condition, the grooves of the flat layer are larger and deeper, when the anode layer is deposited by adopting a plasma magnetron sputtering process, a part of electrode material is deposited on the bosses to form the anodes, and the other part of electrode material is deposited into the grooves and disconnected from the structures of the anodes on the bosses, so that the hollow structures are formed on the anodes on the bosses; and under a second condition, the grooves of the flat layer is smaller and shallower, when the anode layer is deposited by adopting the plasma magnetron sputtering process, an electrode material layer deposited on the bosses and an electrode material layer deposited in the grooves cannot be completely disconnected, at the moment, the electrode material in the grooves can be etched away through an patterning process of anodes, and thus the hollow structures are formed on the anodes on the bosses.

In some embodiments, the grooves are strip-shaped grooves extending in an arrangement direction of the pixel units, and orthographic projections of the groove on the base substrate are overlapped with orthographic projections of the plurality of pixel units on the base substrate.

Specifically, the grooves are strip-shaped grooves extending in the arrangement direction of the pixel units, and each groove corresponds to multiple pixel units which are sequentially arranged, so that the multiple pixel units can share one groove, the anode deficiencies formed by anodes of the multiple pixel units are accommodated in the groove, and thus in the subsequent anode deficiencies clearing work, the anode deficiencies can be conveniently cleared in a centralized mode as the anode deficiencies of the multiple pixel units are accommodated in the groove.

In addition, each groove corresponds to multiple pixel units, and is large in size, so that patterning design is convenient, and the patterning process is simplified.

Figure 2A:
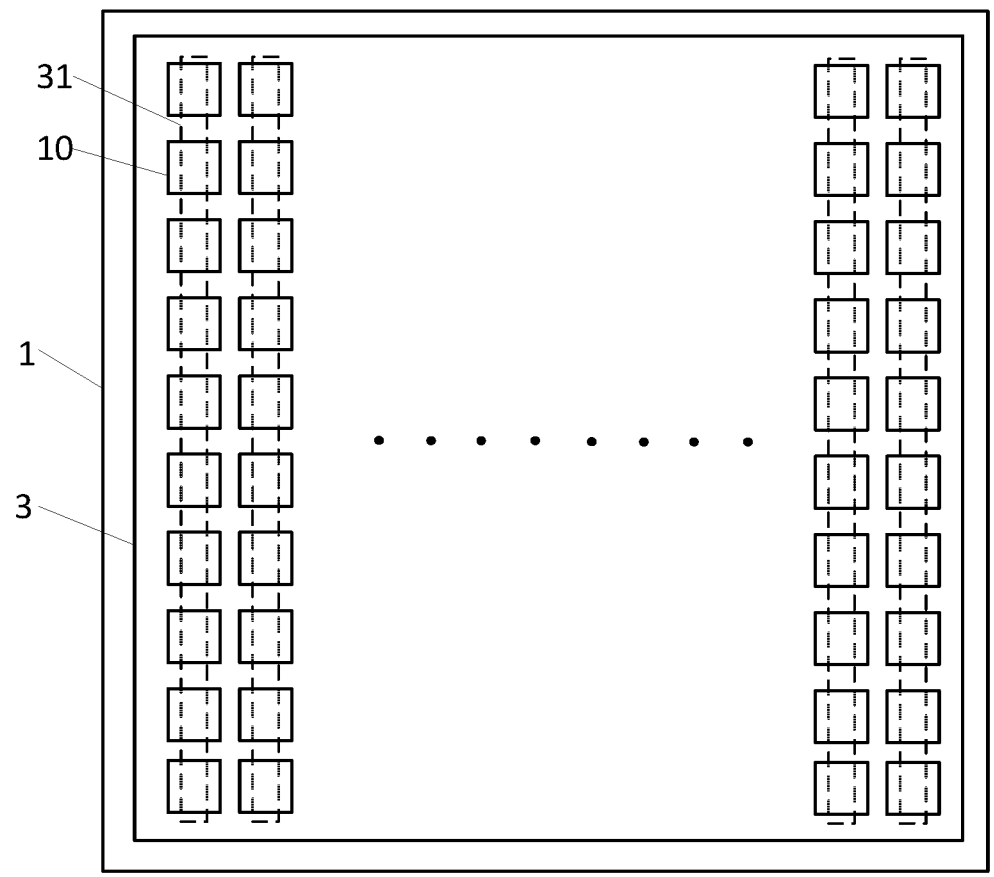
FIG. 2A-FIG. 2C are front structural schematic diagrams of three specific embodiments of a display substrate provided by embodiments of the present application.

Optionally, in an embodiment, as shown in FIG. 2A, the pixel units 10 are distributed in an array mode and include a plurality of pixel unit columns and a plurality of pixel unit rows; the grooves 31 formed in the flat layer 3 correspond to the pixel unit columns one by one; and in each pair of a pixel unit column and a groove 31 corresponding to the pixel unit column, the groove 31 extends in a column direction of the pixel units, and an orthographic projection of each pixel unit 10 in the pixel unit column on the base substrate 1 is overlapped with an orthographic projection of the groove 31 on the base substrate 1.

The grooves formed in the flat layer correspond to the pixel unit columns one by one. In specific implementation, corresponding to each column of the pixel units, a relatively large strip-shaped groove can be formed in the flat layer, and the strip-shaped groove corresponds to the pixel units in the whole column, so that the efficiency can be improved, and in the subsequent anode deficiencies clearing work, the anode deficiencies in each column of pixel units can be cleared in a centralized mode as the anode deficiencies in the whole column are accommodated in the groove.

Figure 2B:
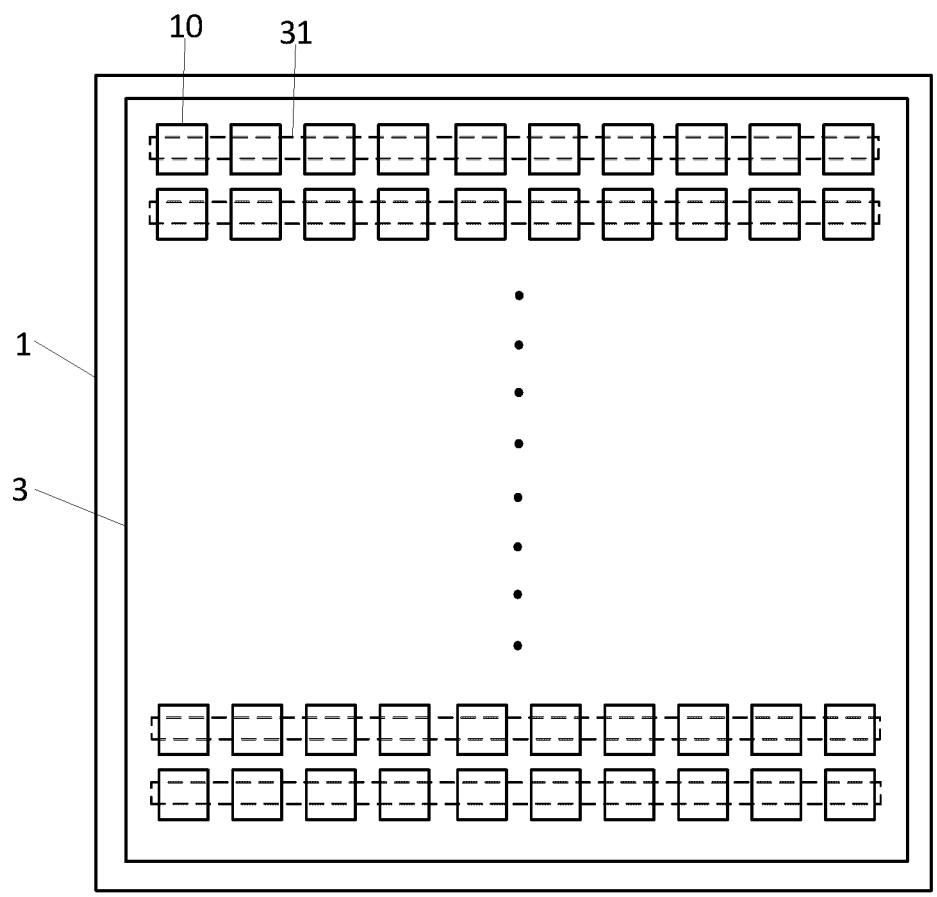

Optionally, in another embodiment, as shown in FIG. 2B, the pixel units 10 are distributed in an array mode and include a plurality of pixel unit columns and a plurality of pixel unit rows; the grooves 31 formed in the flat layer 3 correspond to the pixel unit rows one by one; and in each pair of a pixel unit row and a groove 31 corresponding to the pixel unit row, the groove 31 extends in a row direction of the pixel units, and an orthographic projection of each pixel unit 10 in the pixel unit row on the base substrate 1 is overlapped with an orthographic projection of the groove 31 on the base substrate 1.

In specific implementation, the position of each groove corresponds to the position of one pixel unit row; and each row of pixel units share one groove. In the subsequent anode deficiencies clearing work, the anode deficiencies in the whole row are accommodated in one groove, so that the anode deficiencies of the row of pixel units can be conveniently cleared in a centralized mode.

Figure 2C:
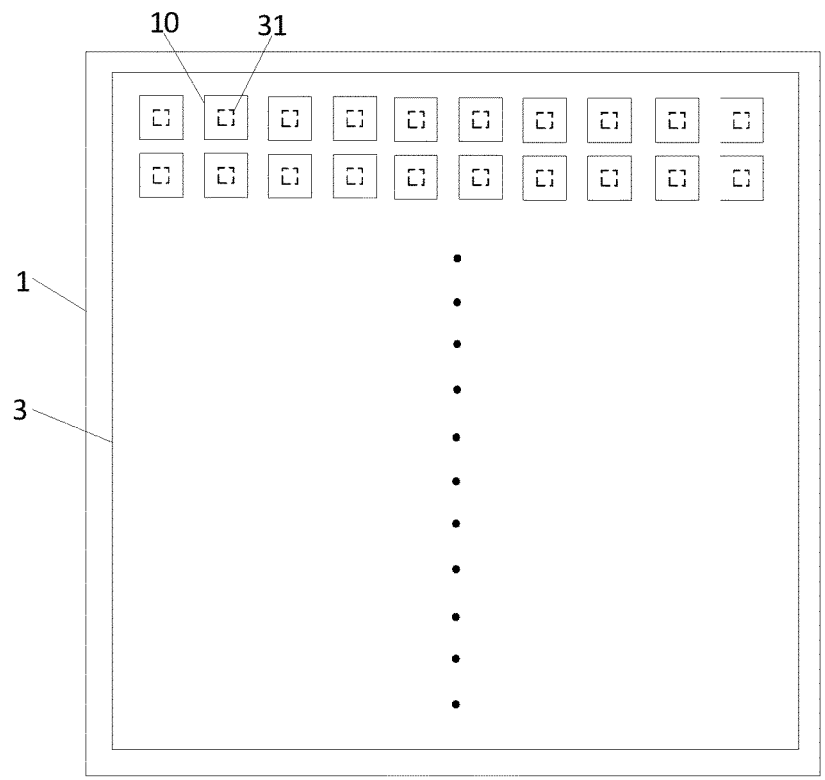

Optionally, in an embodiment, as shown in FIG. 2C, the pixel units 10 are distributed in an array mode, and the grooves 31 formed in the flat layer 3 correspond to the pixel units 10; and in each pair of a pixel unit 10 and a groove 31 corresponding to the pixel unit 10, an orthographic projection of the groove 31 on the base substrate 1 is located within an orthographic projection of the pixel unit 10 on the base substrate 1.

In specific implementation, the grooves correspond to the pixel units one by one, so as to ensure that the anode in each pixel unit corresponds to a groove in the flat layer, and thus the anode deficiency of the anode is accommodated in the groove.

It should be noted that FIG. 2A to FIG. 2C only show a part of pixel units in the display substrate, wherein black dots represent some pixel units that are not drawn.

Optionally, in an embodiment, cross sections of the grooves are rectangular. Therefore, the shapes of the grooves can be matched with those of the pixel units or the pixel unit rows or the pixel unit columns.

Of course, the positions and shapes of the grooves are not limited to the settings in above-mentioned embodiments of the present application, and the cross sections of the grooves are not limited to be rectangular. For example, in an actual manufacturing process, an orthographic projection of each groove can be overlapped with orthographic projections of multiple adjacent pixel units, and the positions and shapes of the multiple adjacent pixel units are not limited; and the positions and the shapes of the cross sections of the grooves can be determined according to the positions and the shapes of the multiple pixel units. For example, the multiple adjacent pixel units can be approximately circular or trapezoidal, and correspondingly, the cross sections of the grooves can also be circular or trapezoidal.

As shown in FIG. 1, in some embodiments, the display substrate of the embodiments of the present application further includes a pixel defining layer 4, wherein the pixel defining layer is located on a side, away from the base substrate 1, of the flat layer 3, and used for defining each pixel unit region.

Specifically, when the grooves correspond to the pixel units one by one, an orthographic projection of the pixel defining layer on the base substrate is located within orthographic projections of bosses of the flat layer on the base substrate, that is, the orthographic projection of the pixel defining layer is not overlapped with the orthographic projections of the grooves, and the grooves are not covered and filled.

Specifically, when the grooves correspond to the pixel unit rows or columns one by one, the orthographic projection of the pixel defining layer on the base substrate is overlapped with the orthographic projections of the bosses and the grooves on the base substrate. For example, when the grooves correspond to the pixel unit rows one by one, the grooves extend in a pixel unit row direction; a part, located between two adjacent pixel units in a row of the pixel units, of the pixel defining layer can cover and fill a corresponding region of the groove, so as to separate the corresponding groove here, and therefore, the orthographic projection of the pixel defining layer is overlapped with the orthographic projections of the grooves. When the grooves correspond to the pixel unit columns one by one, the situation is similar, and details are not described again.

In some embodiments, the display substrate of the embodiments of the present application further includes light emitting layers corresponding to the anodes one by one; and in each pair of an anode and a light emitting layer corresponding to the anode, the light emitting layer covers the anode and fills the corresponding groove of the flat layer and a hollow structure of the anode.

Specifically, after the pixel defining layer and the anodes are formed, the light emitting layers of the pixel units are prepared; in each pixel unit region, the anode is provided with the hollow structure through which the corresponding groove of the flat layer blow is exposed, so that the light emitting layer can cover and fill the hollow structure of the anode and the groove of the flat layer below. Therefore, a cathode formed on the light emitting layer can keep a film layer continuous, and thus the yield of the light emitting device can be ensured.

An embodiment of the present application further provides a display panel, including any above-mentioned display substrate.

Specifically, the display substrate is a driving backboard, and the display panel is an AMOLED display panel.

Based on the above-mentioned display substrate, the present application further provides a method for preparing the display panel, which is used for preparing the above-mentioned display substrate. The method includes:

forming a pixel circuit layer, a flat layer and an anode layer on a base substrate sequentially, and forming a pattern of the flat layer and patterns of anodes through a patterning process, wherein in the pattern of the flat layer: a plurality of grooves of which openings are away from the base substrate are formed in the flat layer; a boss is formed between each two adjacent grooves; and a projection of each pixel unit on the base substrate is overlapped with a projection of the corresponding groove on the base substrate; and in a pattern of an anode in each pixel unit: the anode is formed on the boss; a hollow structure is arranged at a part, opposite to a corresponding groove of the flat layer, of the anode; and an orthographic projection of the anode on the base substrate is located within an orthographic projection of the boss on the base substrate.

Optionally, in an embodiment, the step of forming the pixel circuit layer, the flat layer and the anode layer on the base substrate sequentially, and forming the pattern of the flat layer and the patterns of the anodes through the patterning process includes the following steps.

Step 1, the pixel circuit layer and the flat layer are sequentially formed on the base substrate.

In specific implementation, the pixel circuit layer is firstly deposited on the base substrate through a deposition process, then the flat layer is deposited on the pixel circuit layer through the deposition process. One side of the flat layer is in contact with the pixel circuit layer and faces the base substrate, while the other side of the flat layer is away from the base substrate.

Step 2, the flat layer is etched, and a plurality of grooves are formed on a side, away from the base substrate, of the flat layer.

The plurality of grooves are etched in the flat layer by using an etching process, the number of the grooves depends on the number of pixel units and is set flexibly. The number of the pixel units is M=A×B, A is the number of the pixel units in each row, and B is the number of the pixel units in each column; the number of the grooves may be M, and each pixel unit corresponds to one groove; the number of the grooves may be A, and each column of pixel units corresponds to one groove; and the number of the grooves may be B, and each row of pixel units corresponds to one groove.

Some examples are provided below for illustration.

For example, each pixel unit may correspond to one groove, and if the number of the pixel units is 100 which is a pixel array of 10×10, that is, 10 rows×10 columns, 100 grooves need to be etched in the flat layer.

A column can also be used as a unit: 10 pixel units in each column correspond to one groove, and in the above-mentioned example, the number of the columns is 10, so that only 10 grooves need to be etched in the flat layer.

A row can also be used as a unit: 10 pixel units in each row correspond to one groove, the number of the rows is 10, so that only 10 grooves need to be etched in the flat layer.

Step 3, a pixel defining layer is deposited on the etched flat layer.

Step 4, the pixel defining layer is etched for etching away regions, opposite to the pixel units, of the pixel defining layer to expose the grooves.

Projections of the regions etched away of the pixel defining layer are overlapped with orthographic projections of the grooves in the flat layer, and also overlapped with orthographic projections of the bosses of the flat layer, that is, the regions etched away of the pixel defining layer expose the grooves, and also expose a part of bosses. For example, optionally, the grooves correspond to the pixel units one by one, and the orthographic protection of each groove in the flat layer can be located at the central position of the orthographic projection of each region etched away of the pixel defining layer.

Step 5, the anode layer is deposited.

After the pixel defining layer is etched, the anode layer is further deposited on the pixel defining layer.

Step 6, the anode layer is etched for etching away regions, opposite to groove regions, of the anode layer to form hollow structures of the anodes.

In a conventional preparation process, after the anodes are prepared and in the process of clearing by adopting the HPMJ technology, the anodes are easily bent, deform and upwarp.

However, in the preparation method of the invention, a part of the anodes are etched off to separate the connected anodes, so that stress can be relieved, a phenomenon of anode upwarping can be avoided, and even if the anodes deform in a subsequent process and a part of the anodes spatially extend out, as the anodes are provided with the hollow structures, a spatial margin is provided for deformation of the anodes, and part of the deformation can be accommodated, so as to avoid upwarping of the anodes. In addition, if stress edges of structures of the anodes partially fall off to cause anode deficiencies, the grooves in the flat layer can also accommodate the anode deficiencies, so that defectiveness of the display panel caused by the anode deficiencies is avoided.

A preparation process of the display substrate provided by the above-mentioned embodiment will be further explained below with reference to FIG. 3A-FIG. 3G.

Figure 3A:
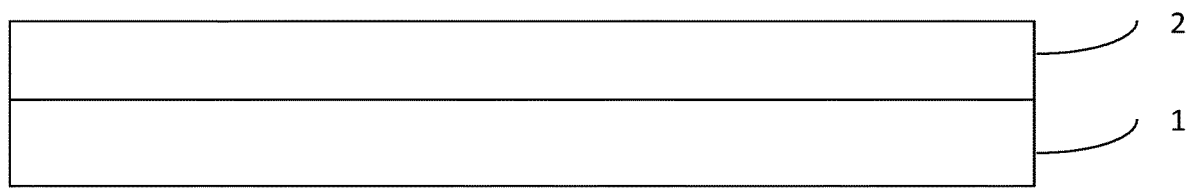
FIG. 3A-FIG. 3G are schematic diagrams of a preparation process of a display substrate provided by an embodiment of the present application.

Step 101, referring to FIG. 3A, a pixel circuit layer 2 is deposited on a base substrate 1.

Figure 3B:
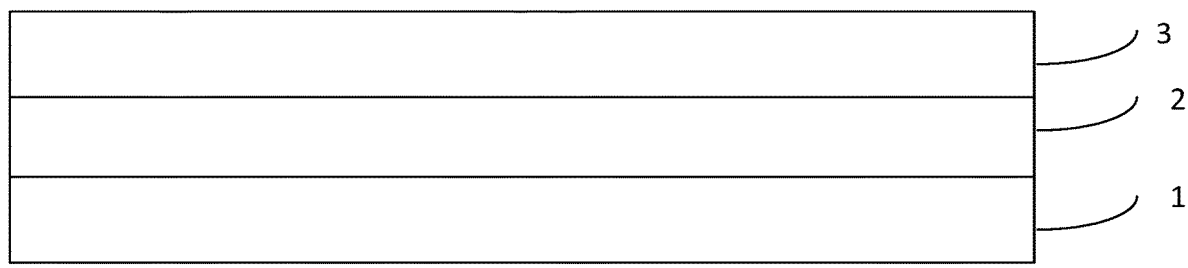

Step 102, referring to FIG. 3B, a flay layer 3 is deposited on the pixel circuit layer 2.

Figure 3C:
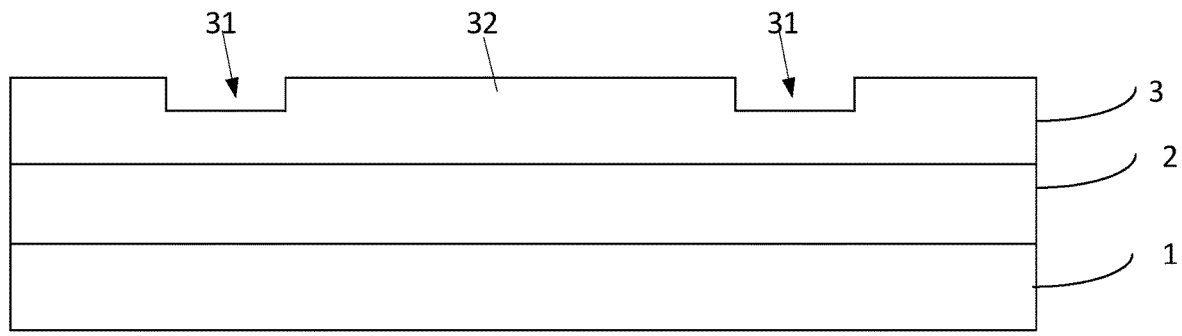

Step 103, referring to FIG. 3C, the flat layer 3 is etched to form a plurality of grooves 31 on a side, away from the base substrate 1, of the flat layer; bosses 32 are formed between the adjacent grooves 31; and the positions of the grooves 31 are opposite to the positions of the pixel units.

In specific implementation, a mask etching process is utilized to form grooves in required positions, and the sizes and positions of the grooves can be flexibly set.

Figure 3D:
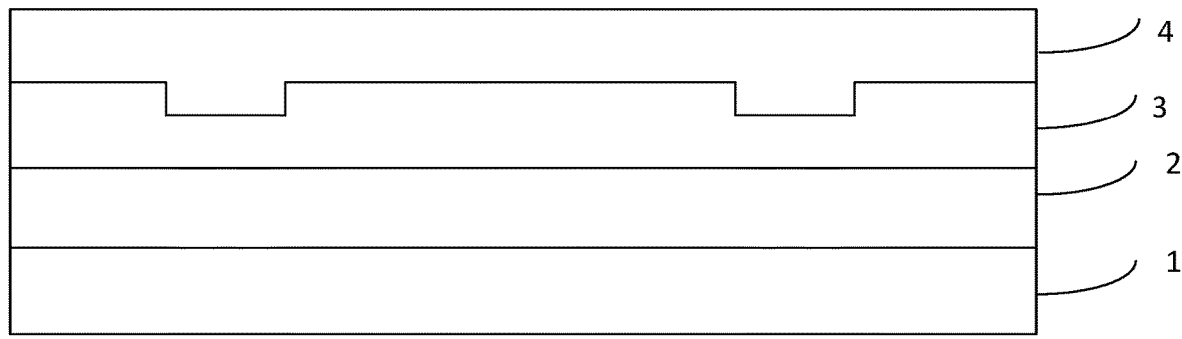

Step 104, referring to FIG. 3D, a pixel defining layer 4 is deposited on the etched flat layer 3.

Figure 3E:
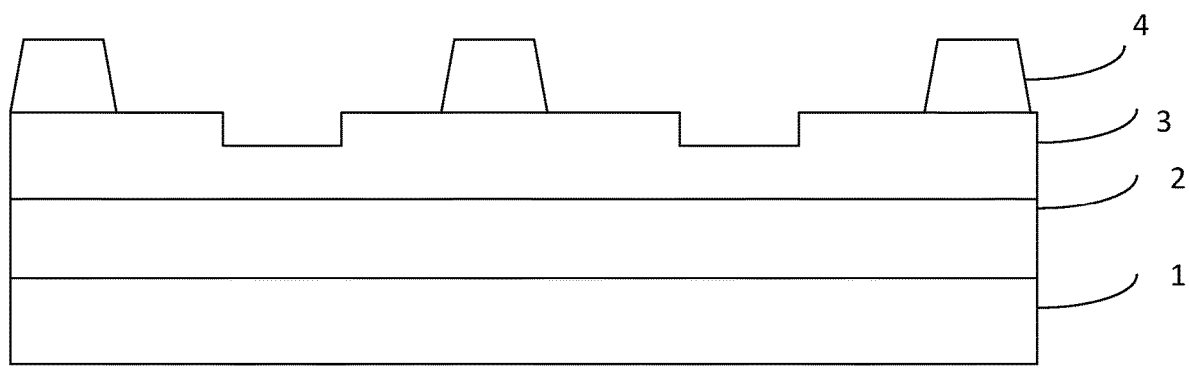

Step 105, referring to FIG. 3E, the pixel defining layer 4 is etched for etching away regions, opposite to pixel units, of the pixel defining layer to expose the grooves and a part of bosses.

Figure 3F:
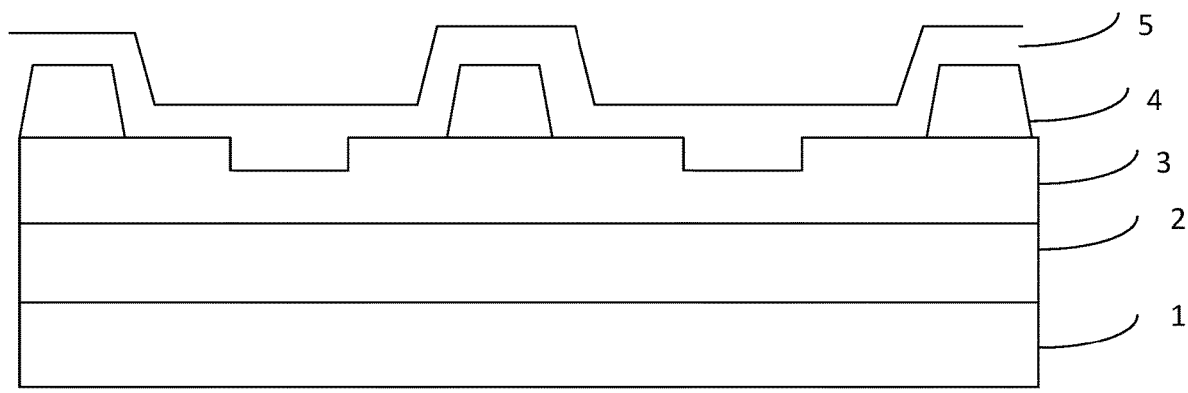

Step 106, referring to FIG. 3F, an anode layer 5 is deposited on the etched pixel defining layer 4.

Figure 3G:
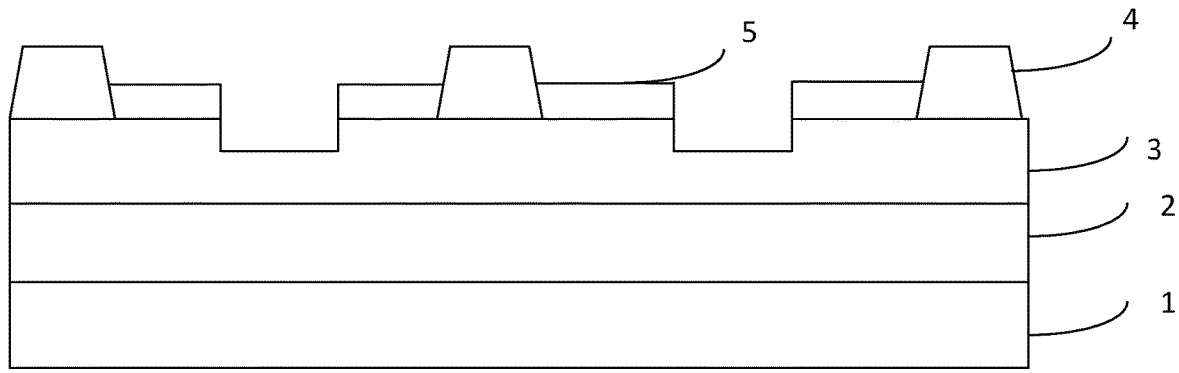

Step 107, referring to FIG. 3G, the anode layer 5 is etched for etching away regions, opposite to groove regions in the flat layer, of the anode layer to form patterns of the anodes.

In the above-mentioned embodiment, a mask process is performed once for etching the flat layer 3; and in the following embodiments, the mask process is performed twice for etching the flat layer 3.

Optionally, in another embodiment, the step of forming a pixel circuit layer, a flat layer and an anode layer on a base substrate sequentially, and forming a pattern of the flat layer and patterns of anodes through a patterning process includes the following steps.

Step 1, the pixel circuit layer, the flat layer and a pixel defining layer are sequentially formed on the base substrate.

Step 2, the pixel defining layer is coated with a layer of photoresist.

Step 3, half tone exposure treatment is carried out on the photoresist; regions, opposite to groove regions to be formed in the flat layer, of the photoresist are removed; regions, opposite to the formed pattern of the pixel defining layer, of the photoresist are reserved; and other regions of the photoresist are partially removed.

Step 4, after the above-mentioned steps are performed, parts of the pixel defining layer are exposed, and are the regions opposite to the groove regions in the flat layer, so that a plurality of grooves are formed on a side, away from the base substrate, of the pixel defining layer by etching the regions for the first time; and the positions of the grooves are opposite to the grooves regions in the flat layer.

Step 5, ashing treatment is carried out on the photoresist; and parts, except the regions opposite to the formed pixel defining layer pattern, of the photoresist are removed.

Step 6, etching is carried out for the second time for etching away regions, opposite to pixel units, of the pixel defining layer, and for etching away regions, corresponding to the plurality of grooves of the pixel defining layer, of the flat layer, and thus the plurality of grooves are formed on the side, away from the base substrate, of the flat layer; and the positions of the grooves are opposite to the pixel units.

Step 7, the anode layer is deposited.

Step 8, the anode layer is etched for etching away the regions, opposite to the groove regions in the flat layer, of the anode layer to form hollow structures of the anodes.

In the above-mentioned process, half tone exposure development and ashing need to be carried out on the photoresist, the flat layer and the pixel circuit layer are etched twice, and thus the patterns of the flat layer and the pixel circuit layer are formed.

A preparation process of the display substrate provided by the above-mentioned embodiments will be further explained below with reference to FIG. 4A-FIG. 4F.

Figure 4A:
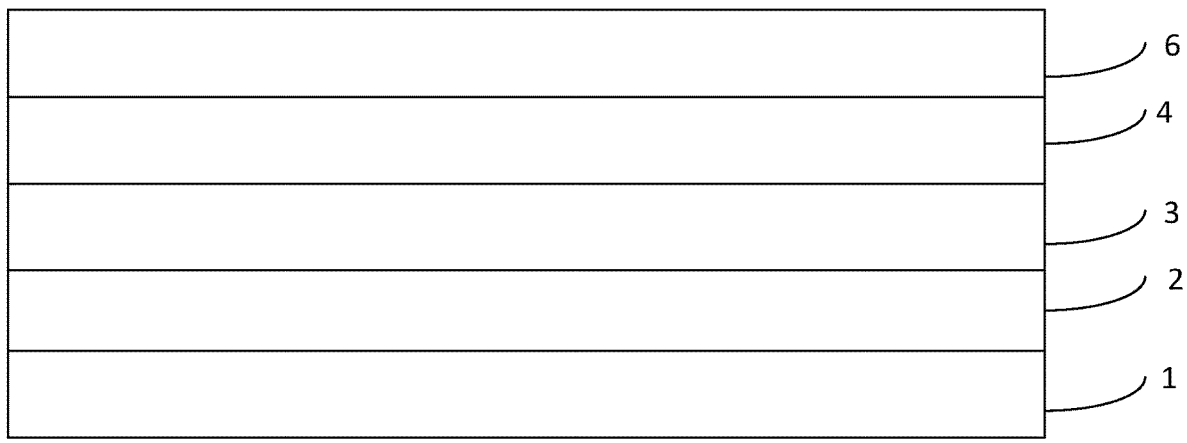
FIG. 4A-FIG. 4F are schematic diagrams of a preparation process of a display substrate provided by another embodiment of the present application.

Step 201, referring to FIG. 4A, a pixel defining layer 4 and a photoresist are sequentially deposited on the basis of FIG. 3B.

Figure 4B:
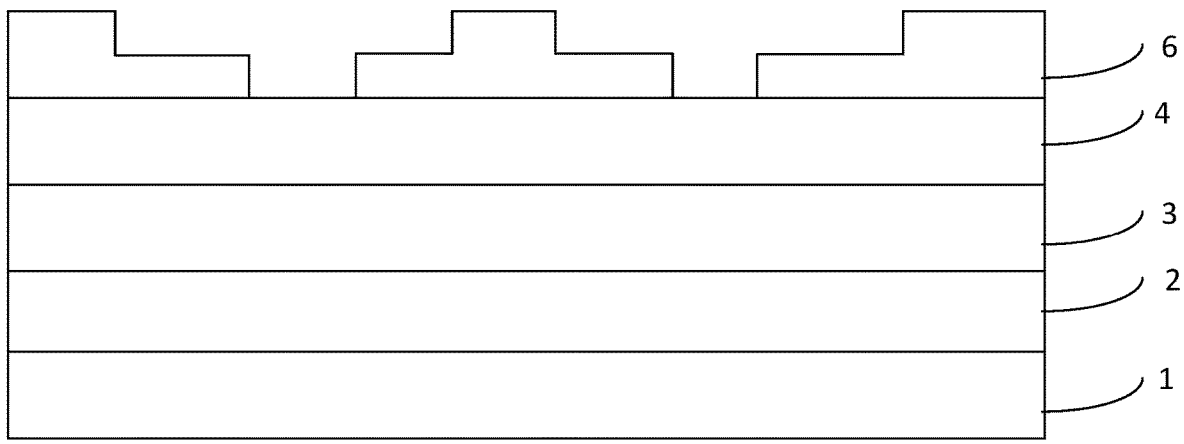

Step 202, referring to FIG. 4B, half tone exposure treatment is carried out on the photoresist, a part of photoresist is removed and thus the pixel defining layer exposes regions opposite to pixel units. Specifically, first regions, opposite to grooves of a flat layer, of the photoresist are removed; second regions, covering a pattern of the pixel defining layer, of the photoresist is reserved; and remained third regions of the photoresist is partially removed.

Figure 4C:
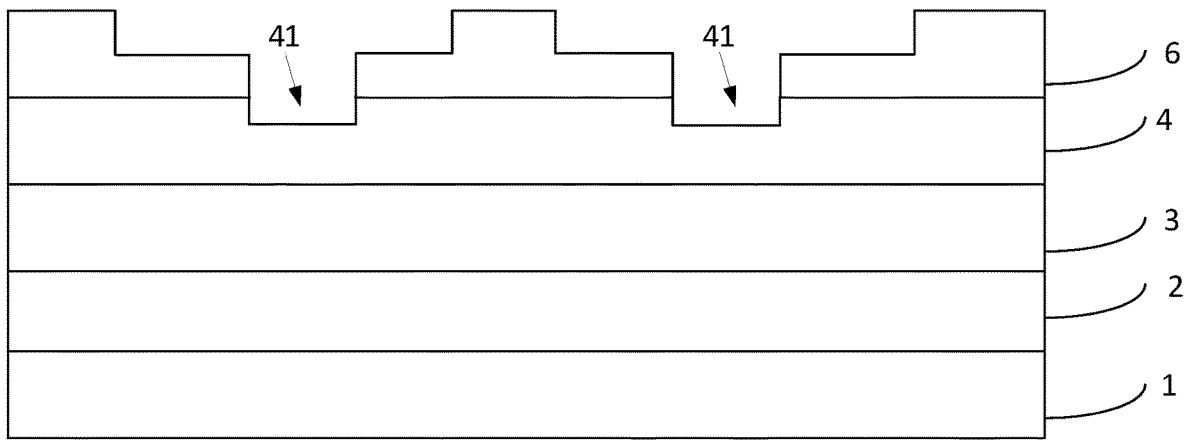

Step 203, referring the FIG. 4C, after the half tone exposure treatment is carried on the photoresist in the previous step, a part of regions of the pixel defining layer are exposed, and the positions of the part of regions are opposite to groove regions of the flat layer in the subsequent step; and the part, exposed outside, of pixel defining layer 4 is etched to form grooves 41, referring to the pattern of FIG. 4C.

Figure 4D:
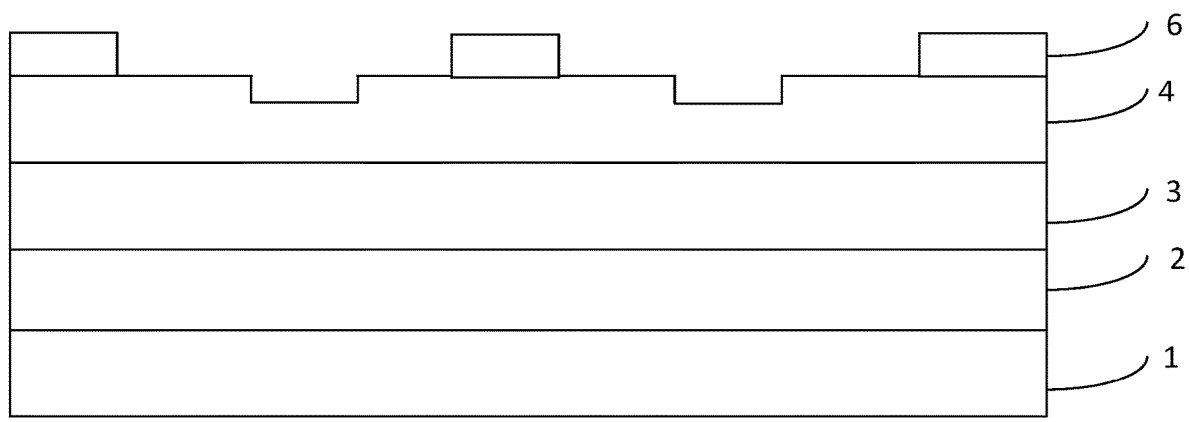

Step 204, referring to FIG. 4D, ashing treatment is carried out on the photoresist on the pixel defining layer 4, the third regions of the photoresist are removed completely, and thus a pattern in FIG. 4D is formed.

Figure 4E:
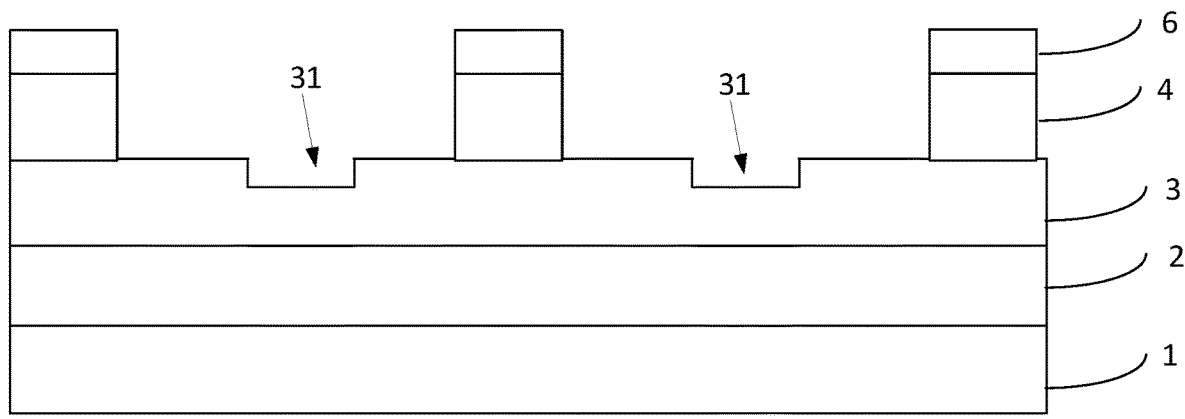

Step 205, referring to FIG. 4E, etching is carried out for the second time, the pixel defining layer 4 and the flat layer 3 are sequentially etched in a groove direction of the pixel defining layer, and thus a pattern of the pixel defining layer is formed, pixel unit regions are defined, and grooves 31 are formed in the flat layer 3, referring to a pattern in FIG. 4E.

Figure 4F:
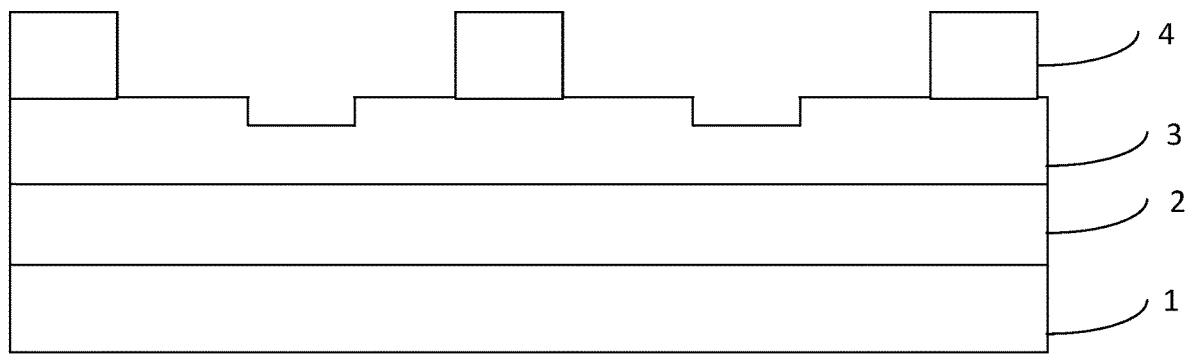

Step 206, referring to FIG. 4F, after the above-mentioned steps, a residual photoresist 6 still remains on the second regions of the pixel defining layer, and the photoresist 6 on the pixel defining layer 4 is peeled off to form a pattern of FIG. 4F.

Subsequently, the steps shown in FIG. 3F-FIG. 3G are utilized to obtain the patterns of the anodes.

It should be noted that in some embodiments of the present disclosure, the method for preparing the display substrate may further include more steps, which also can be determined according to actual needs, and is not limited by the embodiments of the present disclosure. In addition, in the method for preparing the display substrate provided by the embodiments of the present disclosure, the specific techniques and preparation processes for sequentially forming the pixel circuit layer, the flat layer, the pixel defining layer and the anode layer on the base substrate are not limited to the above-mentioned embodiments, and other techniques and preparation processes may also be used, for example, it is also possible to firstly form the pattern of the anode layer on the flat layer, and then form the pattern of the pixel defining layer. Specifically, other embodiments of the method for preparing the display substrate of the present disclosure may refer to the above description of the structure of each layer in the display substrate, which will not be repeated herein.

Obviously, those skilled in the art can make various modifications and variations to the embodiments of the present application without departing from the spirit and scope of the present application. Therefore, if these modifications and variations of the present application fall within the scope of the claims of the present application and equivalent technologies thereof, the present application is also intended to include these modifications and variations.

What is claimed is:

1. A display substrate, comprising:
   a base substrate;
   a pixel circuit layer and a flat layer which are arranged on the base substrate sequentially; and
   anodes arranged on a side, away from the base substrate, of the flat layer and corresponding to a plurality of pixel units one by one;

wherein:
a plurality of grooves of which openings are away from the base substrate are formed in the flat layer;
a boss is formed between each two adjacent grooves;
an orthographic projection of each pixel unit on the base substrate is overlapped with an orthographic projection of a corresponding groove on the base substrate; and
in each pixel unit: an anode is formed on the boss; a hollow structure is arranged at a part, opposite to a corresponding groove of the flat layer, of the anode; and an orthographic projection of the anode on the base substrate is arranged within an orthographic projection of the boss on the base substrate;
wherein the grooves are strip-shaped grooves extending in an arrangement direction of the pixel units;
wherein the display substrate further comprises a pixel defining layer; and the pixel defining layer is arranged on a side, away from the base substrate, of the flat layer, and used for defining each pixel unit region;
wherein the pixel units are distributed in an array mode and comprise a plurality of pixel unit columns and a plurality of pixel unit rows; the grooves formed in the flat layer correspond to the pixel unit columns one by one; and in each pair of a pixel unit column and a groove corresponding to the pixel unit column: the groove extends in a column direction of the pixel units, and an orthographic projection of each pixel unit in the pixel unit column on the base substrate is overlapped with an orthographic projection of the groove on the base substrate; wherein an orthographic projection of a part, arranged between two adjacent pixel units in the pixel unit column, of the pixel defining layer on the base substrate is overlapped with the orthographic projection of the groove on the base substrate;
or,
the pixel units are distributed in an array mode and comprise a plurality of pixel unit columns and a plurality of pixel unit rows; the grooves formed in the flat layer correspond to the pixel unit rows one by one; and in each pair of a pixel unit row and a groove corresponding to the pixel unit row: the groove extends in a row direction of the pixel units, and an orthographic projection of each pixel unit in the pixel unit row on the base substrate is overlapped with an orthographic projection of the groove on the base substrate; wherein an orthographic projection of a part, arranged between two adjacent pixel units in the pixel unit row, of the pixel defining layer on the base substrate is overlapped with the orthographic projection of the groove on the base substrate.

2. The display substrate according to claim 1, wherein orthographic projections of the grooves on the substrate are overlapped with orthographic projections of the plurality of pixel units on the substrate.

3. The display substrate according to claim 1, further comprising light emitting layers corresponding to the anodes one by one, wherein
in each pair of an anode and a light emitting layer corresponding to the anode, the light emitting layer covers the anode and fills the corresponding groove of the flat layer and a hollow structure of the anode.

4. The display substrate according to claim 1, wherein cross sections of the grooves are rectangular.

5. A display panel, comprising a display substrate;
wherein the display substrate comprises a base substrate; a pixel circuit layer and a flat layer which are arranged on the base substrate sequentially; and anodes arranged on a side, away from the base substrate, of the flat layer and corresponding to a plurality of pixel units one by one;
wherein a plurality of grooves of which openings are away from the base substrate are formed in the flat layer;
a boss is formed between each two adjacent grooves;
an orthographic projection of each pixel unit on the base substrate is overlapped with an orthographic projection of a corresponding groove on the base substrate; and
in each pixel unit: an anode is formed on the boss; a hollow structure is arranged at a part, opposite to a corresponding groove of the flat layer, of the anode; and an orthographic projection of the anode on the base substrate is arranged within an orthographic projection of the boss on the base substrate;
wherein the grooves are strip-shaped grooves extending in an arrangement direction of the pixel units;
wherein the display substrate further comprises a pixel defining layer; and the pixel defining layer is arranged on a side, away from the base substrate, of the flat layer, and used for defining each pixel unit region;
wherein the pixel units are distributed in an array mode and comprise a plurality of pixel unit columns and a plurality of pixel unit rows; the grooves formed in the flat layer correspond to the pixel unit columns one by one; and in each pair of a pixel unit column and a groove corresponding to the pixel unit column: the groove extends in a column direction of the pixel units, and an orthographic projection of each pixel unit in the pixel unit column on the base substrate is overlapped with an orthographic projection of the groove on the base substrate; wherein an orthographic projection of a part, arranged between two adjacent pixel units in the pixel unit column, of the pixel defining layer on the base substrate is overlapped with the orthographic projection of the groove on the base substrate;
or,
the pixel units are distributed in an array mode and comprise a plurality of pixel unit columns and a plurality of pixel unit rows; the grooves formed in the flat layer correspond to the pixel unit rows one by one; and in each pair of a pixel unit row and a groove corresponding to the pixel unit row: the groove extends in a row direction of the pixel units, and an orthographic projection of each pixel unit in the pixel unit row on the base substrate is overlapped with an orthographic projection of the groove on the base substrate; wherein an orthographic projection of a part, arranged between two adjacent pixel units in the pixel unit row, of the pixel defining layer on the base substrate is overlapped with the orthographic projection of the groove on the base substrate.

* * * * *